United States Patent
Tanaka

(10) Patent No.: US 10,165,651 B2
(45) Date of Patent: Dec. 25, 2018

(54) LED ILLUMINATION SYSTEM, LED ILLUMINATION DEVICE, AND BRIGHTNESS ADJUSTMENT METHOD FOR LED ILLUMINATION DEVICE

(71) Applicant: CCS Inc., Kyoto-shi, Kyoto (JP)

(72) Inventor: Yuichiro Tanaka, Kyoto (JP)

(73) Assignee: CCS Inc., Kyoto-shi, Kyoto (JP)

( * ) Notice: Subject to any disclaimer, the term of this patent is extended or adjusted under 35 U.S.C. 154(b) by 0 days.

(21) Appl. No.: 15/743,602

(22) PCT Filed: Jul. 26, 2016

(86) PCT No.: PCT/JP2016/071894
§ 371 (c)(1),
(2) Date: Jan. 10, 2018

(87) PCT Pub. No.: WO2017/018418
PCT Pub. Date: Feb. 2, 2017

(65) Prior Publication Data
US 2018/0206307 A1    Jul. 19, 2018

(30) Foreign Application Priority Data
Jul. 29, 2015  (JP) ................. 2015-149204

(51) Int. Cl.
*H05B 37/02* (2006.01)
*H05B 33/08* (2006.01)
*H01L 51/52* (2006.01)

(52) U.S. Cl.
CPC ......... *H05B 37/02* (2013.01); *H05B 33/0851* (2013.01); *H05B 33/0866* (2013.01); *H01L 51/5296* (2013.01)

(58) Field of Classification Search
CPC .. H05B 33/08; H05B 33/083; H05B 33/0845; H05B 33/0851; H05B 33/0866; H05B 37/02
See application file for complete search history.

(56) References Cited

U.S. PATENT DOCUMENTS

| | | | |
|---|---|---|---|
| 2013/0127353 A1* | 5/2013 | Athalye | H05B 33/0815 315/193 |
| 2013/0147359 A1* | 6/2013 | Chobot | H05B 33/083 315/122 |
| 2013/0307415 A1* | 11/2013 | Ni | H05B 33/0812 315/122 |

FOREIGN PATENT DOCUMENTS

| | | |
|---|---|---|
| JP | 2002043684 A | 2/2002 |
| JP | 2005093196 A | 4/2005 |

(Continued)

OTHER PUBLICATIONS

ISA Japan Patent Office, International Search Report Issued in PCT Application No. PCT/JP2016/071894, dated Nov. 1, 2016, WIPO, 4 pages. (Submitted with English Translation of International Search Report).

*Primary Examiner* — Thai Pham
(74) *Attorney, Agent, or Firm* — Alleman Hall Creasman & Tuttle LLP

(57) ABSTRACT

In an LED illumination system including a power supply device having a function of adjusting an amount of a supply current and an LED illumination device connected to the power supply device, the LED illumination device includes: an LED circuit; a bypass circuit; and a distribution circuit that distributes a current supplied from the power supply device at a predetermined fixed ratio regardless of a current value and supplies one part thereof to the LED circuit and the other part thereof to the bypass circuit.

2 Claims, 3 Drawing Sheets

(56) References Cited

FOREIGN PATENT DOCUMENTS

| | | |
|---|---|---|
| JP | 2009152518 A | 7/2009 |
| JP | 2009205810 A | 9/2009 |
| JP | 2010504628 A | 2/2010 |
| JP | 2012169086 A | 9/2012 |
| JP | 2015503193 A | 1/2015 |

* cited by examiner

LED ILLUMINATION SYSTEM, LED ILLUMINATION DEVICE, AND BRIGHTNESS ADJUSTMENT METHOD FOR LED ILLUMINATION DEVICE

TECHNICAL FIELD

The present invention relates to an LED illumination system and an LED illumination device capable dimming using an LED, and relates to ones used, for example, in surface inspection or shape recognition, exposure, resin cure, and the like.

BACKGROUND ART

In this kind of an LED illumination system, it is required that each of the LED illumination devices emits light at a brightness according to a light adjustment. It is necessary to configure that, for example, not only the same brightness can be obtained by any LED illumination device in the case where a dimming degree in a power supply device side is 100% but also half of the same brightness can be obtained by any LED illumination device in the case where the dimming degree is 50%.

Meanwhile, since forward current/relative luminosity characteristics are uneven for every LED, even though the current of the same value is supplied from the power supply device, the brightness may be different in each of the LED illumination devices in some cases.

Therefore, conventionally, it has been adapted that the brightness of the respective LED illumination devices is measured prior to shipment to thereby have the respective LED illumination devices provided with brightness characteristic information related to the brightness thereof.

Thus, in the power supply device, by communicating with each of the LED illumination devices, the brightness characteristic information of each of the LED illumination devices is acquired, and the supply current is varied for every LED illumination device so that the respective LED illumination devices emit light with the same brightness at the respective dimming degrees (see Patent Literature 1, Patent Literature 2).

CITATION LIST

Patent Literature

Patent Literature 1: JP 2005-93196A
Patent Literature 2: JP 2012-169086A

SUMMARY OF INVENTION

Technical Problem

However, in such a method, in order to obtain brightness characteristic information of the respective LED illumination devices, it is necessary that the power supply device has a function of communicating with the LED illumination devices. Moreover, even though commanded dimming degrees are the same, it is necessary to provide a specific circuit for causing different currents to flow to the respective LED illumination devices based on the brightness characteristic information.

The present invention has been made in order to solve the above issues all at once, and it is intended that, only by uniformly performing current controls in the power supply device side, the brightness of the respective LED illumination devices is made equal with respect to the respective dimming degrees, thereby making a communication function and a complicated dimming function in the power supply device side unnecessary.

Solution to Problem

That is, an LED illumination system according to the present invention includes: a power supply device which can variably set a supply current; and an LED illumination device connected to the power supply device, and in this LED illumination system, the LED illumination device includes: an LED circuit; a bypass circuit; and a distribution circuit that distributes the current supplied from the power supply device at a predetermined fixed ratio regardless of a current value and supplies one part thereof to the LED circuit and the other part thereof to the bypass circuit.

In accordance with this configuration, by setting to one dimming degree (one current value), for example, 100% in the power supply device side, under this condition, so long as the ratios are respectively set for every LED illumination device so as to have the same brightness of the respective LED illumination devices, the brightness at the respective dimming degrees is made equal to each other in all of the LED illumination devices.

Accordingly, since it is made unnecessary to provide a communication function for recognizing the respective LED illumination devices in the power supply device and also it is made unnecessary to perform different dimming controls in accordance with the respective LED illumination devices, a remarkable simplification of the configuration can be designed.

Note that the brightness referred here may be luminance or intensity of light emitted from the LED illumination device and also may be illuminance on an object (workpiece) which is irradiated with light in some cases. Further, the light emitted from the LED illumination device is not limited to visible light but may be, for example, ultraviolet rays or infrared rays.

In order to implement the distribution circuit with a simple configuration, it is preferable that the distribution circuit includes: a first resistance element arranged in series with the LED circuit; a second resistance element arranged in series with the bypass circuit; and a voltage maintaining circuit for maintaining voltages applied to the first resistance element and the second resistance element so that the voltages are substantially equal, and the distribution circuit is configured so as to determine the ratio based on a resistance value of the first resistance element and a resistance value of the second resistance element.

In a configuration in which the power supply device includes a constant voltage circuit which generates a constant voltage and a constant current circuit which can variably set the current, and the LED illumination device includes a first terminal connected to the constant voltage circuit and a second terminal connected to the constant current circuit, so that the current set by the constant current circuit is to be supplied, as a specific aspect for implementing the present invention with a simple configuration, there can be included a configuration in which the voltage maintaining circuit includes a pair of transistors of which base potentials are kept equal, and in this configuration, the first resistance element is arranged between an emitter of a first transistor and the first terminal, the LED circuit is arranged between a collector of the first transistor and the second terminal, the second resistance element is arranged between an emitter of the second transistor and the first terminal, and the bypass circuit is arranged between a collector of the second transistor and the second terminal.

In order to distribute the current to the bypass circuit and the LED circuit at a more accurate ratio, it is preferable that, the voltage maintaining circuit includes: a differential amplifier circuit having a pair of input terminals; a feedback circuit performing a feedback operation so as to keep potentials of the respective input terminals equal; and a pair of transistors having emitters connected to the respective input terminals so that base potentials are kept equal, and in this configuration, the first resistance element is arranged between the base of the first transistor and the first terminal, and the LED circuit is arranged between the base of the first transistor and the second terminal, and the second resistance element is arranged between the base of the second transistor and the first terminal, and the bypass circuit is arranged between the base of the second transistor and the second terminal.

Advantageous Effects of Invention

Only by uniformly performing current controls in the power supply device side, since the brightness of the respective LED illumination devices is made equal with respect to the respective dimming degrees, the communication function and complicated dimming function in the power supply device side can be made unnecessary.

LIST OF REFERENCE CHARACTERS

Figure 1:
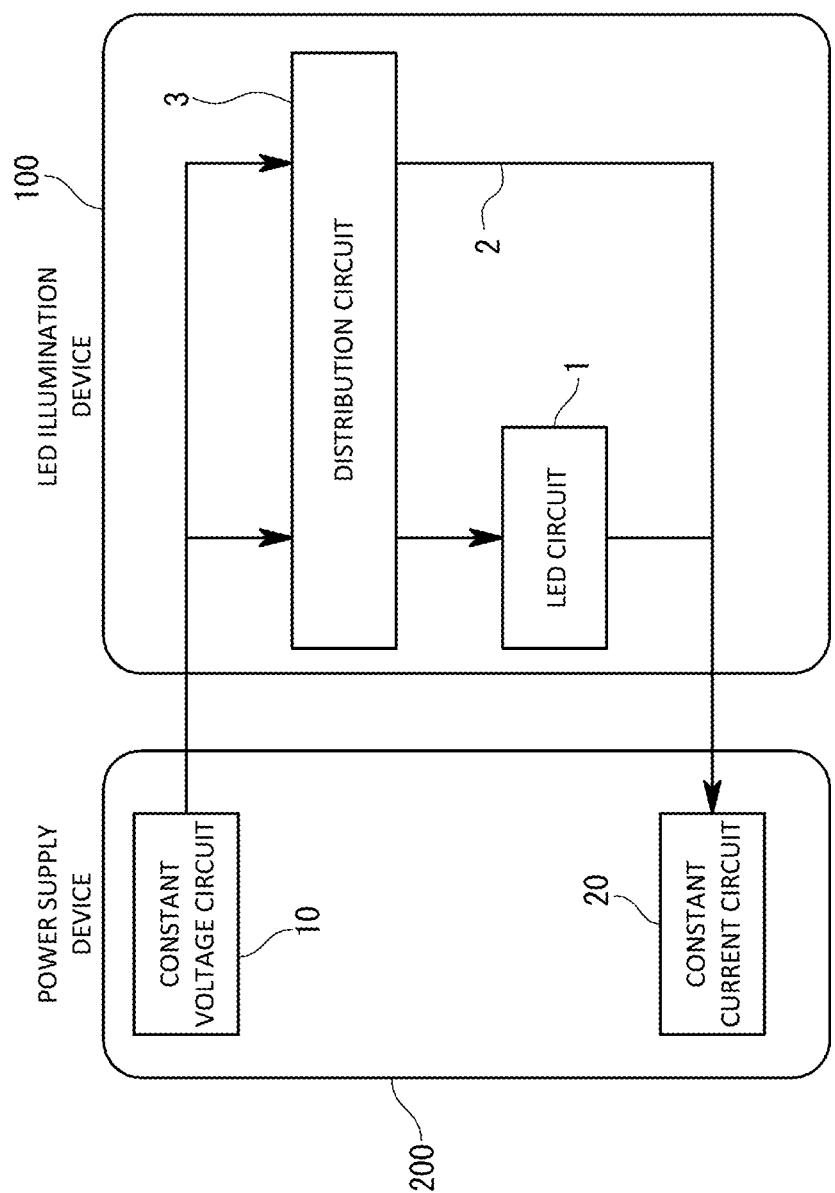
FIG. 1 is a block diagram showing a configuration of an embodiment of the present invention.

200 . . . Power supply device
100 . . . LED illumination device
1 . . . LED circuit
2 . . . Bypass circuit
3 . . . Distribution circuit
4 . . . Voltage maintaining circuit
41 . . . Differential amplifier circuit
42 . . . Feedback circuit
R1 . . . First resistance element
R2 . . . Second resistance element
Q1 . . . First transistor
Q2 . . . Second transistor
10 . . . Constant voltage circuit
20 . . . Constant current circuit

DESCRIPTION OF EMBODIMENTS

A first embodiment of the present invention is described with reference to the drawings.

As shown in FIG. 1, an LED illumination system in the present embodiment includes a power supply device 200 and an LED illumination device 100 connected to the power supply device 200, and it is used for, e.g., surface inspections of various workpieces.

Figure 2:
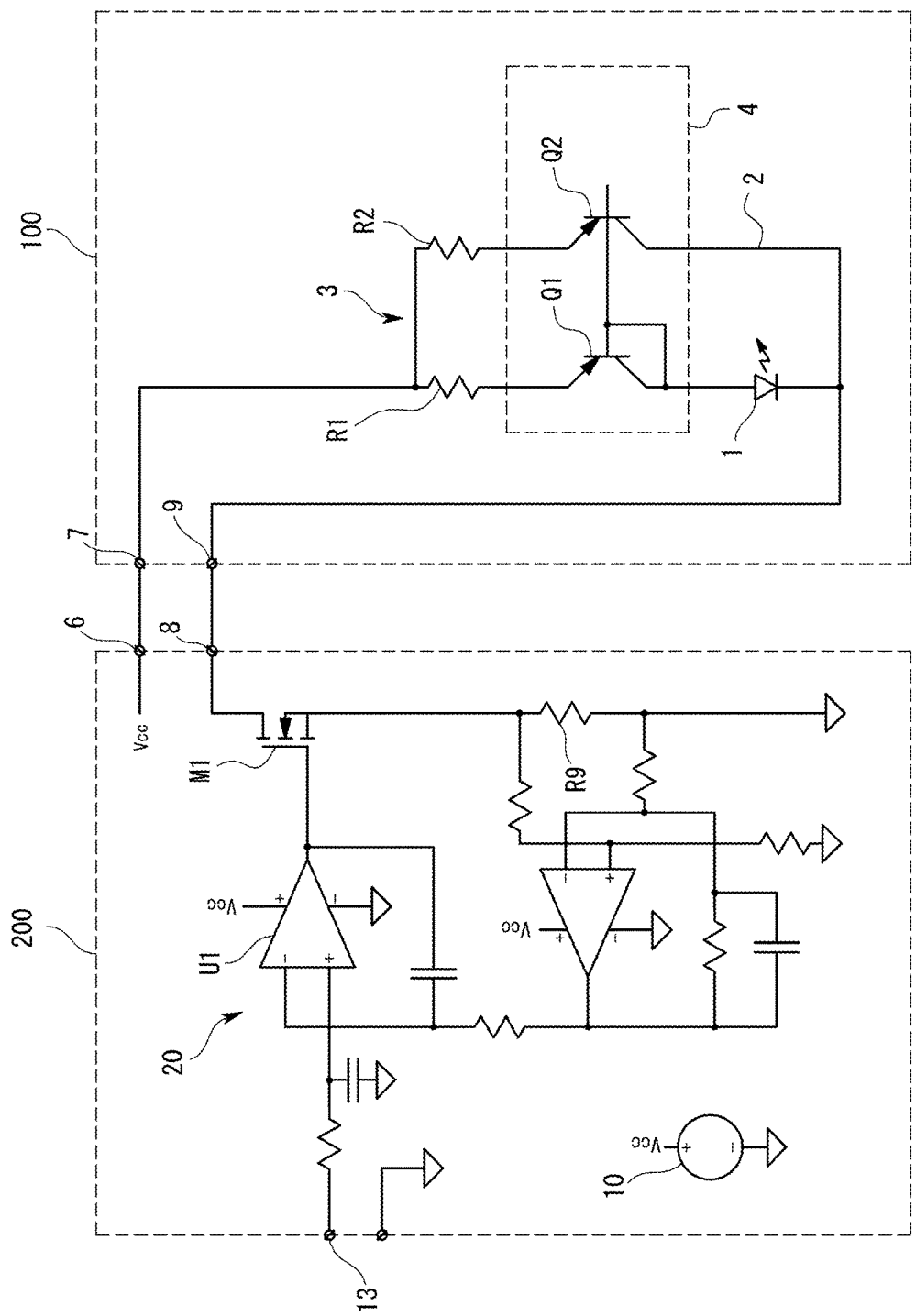
FIG. 2 is a circuit diagram showing a configuration of a first embodiment of the present invention.

As shown in FIG. 2, the power supply device 200 includes: a constant voltage circuit 10; a constant current circuit 20 for controlling a current supplied from the constant voltage circuit 10 to the LED illumination device 100; and a pair of power source terminals 6 and 8.

The constant voltage circuit 10 is adapted to generate a constant voltage and it is configured that this constant voltage is applied to a first power source terminal 6 provided for this power supply device 200.

The constant current circuit 20 is configured to control a current value flowing into the second power source terminal 8 provided in the power supply device 200 to be a predetermined target current value. Note that the current referred here indicates a continuous current.

The current value flowing into the second power source terminal 8 is detected by a voltage generated by a resistance element R9. Meanwhile, the target current value can be set by a voltage value of a command signal inputted to a third terminal 13 provided for this power supply device 200. That is, this constant current circuit 20 can adjust and control the current supplied to the LED illumination device by a command signal from the outside.

The detected current value is compared to the target current value by a comparator circuit U1 and a current control element (a MOSFET (metal-oxide-semiconductor field-effect transistor), herein) M1 connected to the second power source terminal 8 operates so as to cancel the deviation therebetween, and the detected current value is controlled to be the target current value. This target current value is a dimming degree (brightness degree) for a user. Note that although the continuous current is used as described above in the present embodiment, it may be also possible to drive with an intermittent current in accordance with an intermittent voltage inputted to the third terminal 13.

The LED illumination device 100 includes: a first terminal 7 connected to the first power source terminal 6 and applied with a constant voltage; a second terminal 9 connected to the second power source terminal 8 and the current set to the target current value flowing outtherefrom; an LED circuit 1 and a bypass circuit 2 provided in parallel between the first terminal 7 and the second terminal 9; and a distribution circuit 3 that distributes the current supplied from the power supply device 200 at a predetermined fixed ratio and supplies one part thereof to the LED circuit 1 and the other part thereof to the bypass circuit 2.

The LED circuit 1 includes one or a plurality of LEDs connected in series or in parallel. The bypass circuit 2 is a connection line, here.

The distribution circuit 3 includes: a first resistance element R1 arranged in series with the LED circuit 1; a second resistance element R2 arranged in series with the bypass circuit 2; and a voltage maintaining circuit 4 for maintaining voltages to be applied to the first resistance element R1 and the second resistance element R2 to be substantially equal.

This voltage maintaining circuit 4 includes a pair of transistors Q1 and Q2 of which respective bases are connected to each other and potentials thereof are thereby made equal to each other.

The first transistor Q1 of these paired transistors has its base and collector connected so as to have the same potentials. In addition, its emitter is connected to the first terminal 7 via the first resistance element R1, and its collector is connected to the second terminal 9 via the LED circuit 1.

Further, the second transistor Q2 of the paired transistors includes one transistor or a group of a plurality of transistors having their bases, emitters and collectors connected, respectively. The emitter of this second transistor Q2 is connected to the first terminal 7 via the second resistance element R2, and the collector thereof is connected to the second terminal 9 via the bypass circuit 2. It is preferable that the characteristics of the first transistor Q1 and the second transistor Q2 are equal.

With this configuration of the voltage maintaining circuit 4, the reason why the voltages applied to the first resistance element R1 and the second resistance element R2 are substantially equal, will be briefly described below.

Assuming that emitter potentials of the respective transistors Q1 and Q2 are $V_{1e}$ and $V_{2e}$, base potentials are respectively $V_{b1}$ and $V_{b2}$, and voltages between the bases and the emitters are respectively $V_{1BE}$ and $V_{2BE}$, the following equations are formulated.

$$V_{1e} = V_{b1} + V_{1BE} \quad (1)$$

$$V_{2e} = V_{b2} + V_{2BE} \quad (2)$$

As described before, the base potentials of the respective transistors Q1 and Q2 are equal ($V_{b1} = V_{b2}$), and it is conceivable that the voltages between the bases and the emitters of the respective transistors Q1 and Q2 are substantially equal ($V_{1BE} = V_{2BE}$) because these voltages are voltage drops of the diode.

Accordingly, from the equations (1) and (2), the emitter potentials $V_{1e}$ and $V_{2e}$ of the respective transistors Q1 and Q2 are made equal to each other.

In addition, the respective resistance elements R1 and R2 have their one ends connected to the constant voltage circuit 10, respectively and maintained to be equipotential $V_{cc}$ whereas their other ends connected to the emitters of the respective transistors Q1 and Q2 of which the potentials are kept equal to each other. Therefore, this results in the voltages applied to the respective resistance elements R1 and R2 being kept equal all the time.

Next, the following describes an operation of the LED illumination system configured as described above.

In the case where a target current value is set in the power supply device 200 and the voltage $V_{cc}$ is applied from the constant voltage circuit 10, a current flowing into from the first terminal 7 of the LED illumination device 100 flows out from the second terminal 9 through the LED circuit 1 and the bypass circuit 2.

At this time, a current flowing through the LED circuit 1 is equal to a current flowing through the first resistance element R1, and a current flowing through the bypass circuit 2 is equal to a current flowing through the second resistance element R2.

Thus, the ratio of the current flowing through the LED circuit 1 and the current flowing through the bypass circuit 2, that is, the ratio of the current flowing through the first resistance element R1 and the current flowing through the second resistance element R2 is an inverse ratio of a resistance ratio of the respective resistance elements R1 and R2 because the voltages applied to these respective resistance elements R1 and R2 are equal.

Therefore, even though the current value (target current value) supplied to the LED illumination device 100 is adjusted in any way in the power supply device 200, this results in the supplied current being distributed to the LED circuit 1 and the bypass circuit 2 at a constant ratio determined based on the resistance values of the respective resistance elements R1 and R2.

Next, the following describes a method of matching the brightness characteristics of the plural LED illumination devices 100 using such a LED illumination system.

First, currents of the same value are supplied from the power supply device 200 to the respective LED illumination devices 100 and the brightness (the luminance, here) thereof is measured using such as a photo-sensor.

Next, regarding each of the LED illumination devices 100, any one or both of the resistance value of the first resistance element R1 and the resistance value of the second resistance element R2 are adjusted so that the respective LED illumination devices 100 have the brightness equal to each other.

More practically, the following procedures are conceivable.

First, an LED illumination device 100 having the lowermost brightness (also referred to as "lowermost light device," hereinafter) is extracted.

Next, regarding the remaining LED illumination devices 100, any one of the resistance value of the first resistance element R1 and the resistance value of the second resistance element R2 is adjusted so that the brightness when a current equal to a current allowed to flow in the lowermost light device is allowed to flow, is made equal to that of the lowermost light device. An adjustment target may be preferably the second resistance element R2. At this time, by using a variable resistor as a resistance element to be adjusted, the adjustment work is facilitated.

According to the present embodiment configured as described above, by previously setting to one dimming degree (one target current value), for example, 100% in the power supply device side, and, under this condition, so long as the ratios are respectively set for every LED illumination device 100 so as to have the same brightness (luminance) of the respective LED illumination devices 100, the ratios are maintained even though the dimming degrees are varied, and therefore, the brightness at the respective dimming degrees is made equal to each other in all of the LED illumination devices 100.

As a result, since it is made unnecessary to provide a communication function for recognizing the respective LED illumination devices 100 in the power supply device 200 and also it is made unnecessary to perform different dimming controls in accordance with the respective LED illumination devices 100, a remarkable simplification of the configuration can be designed.

Figure 3:
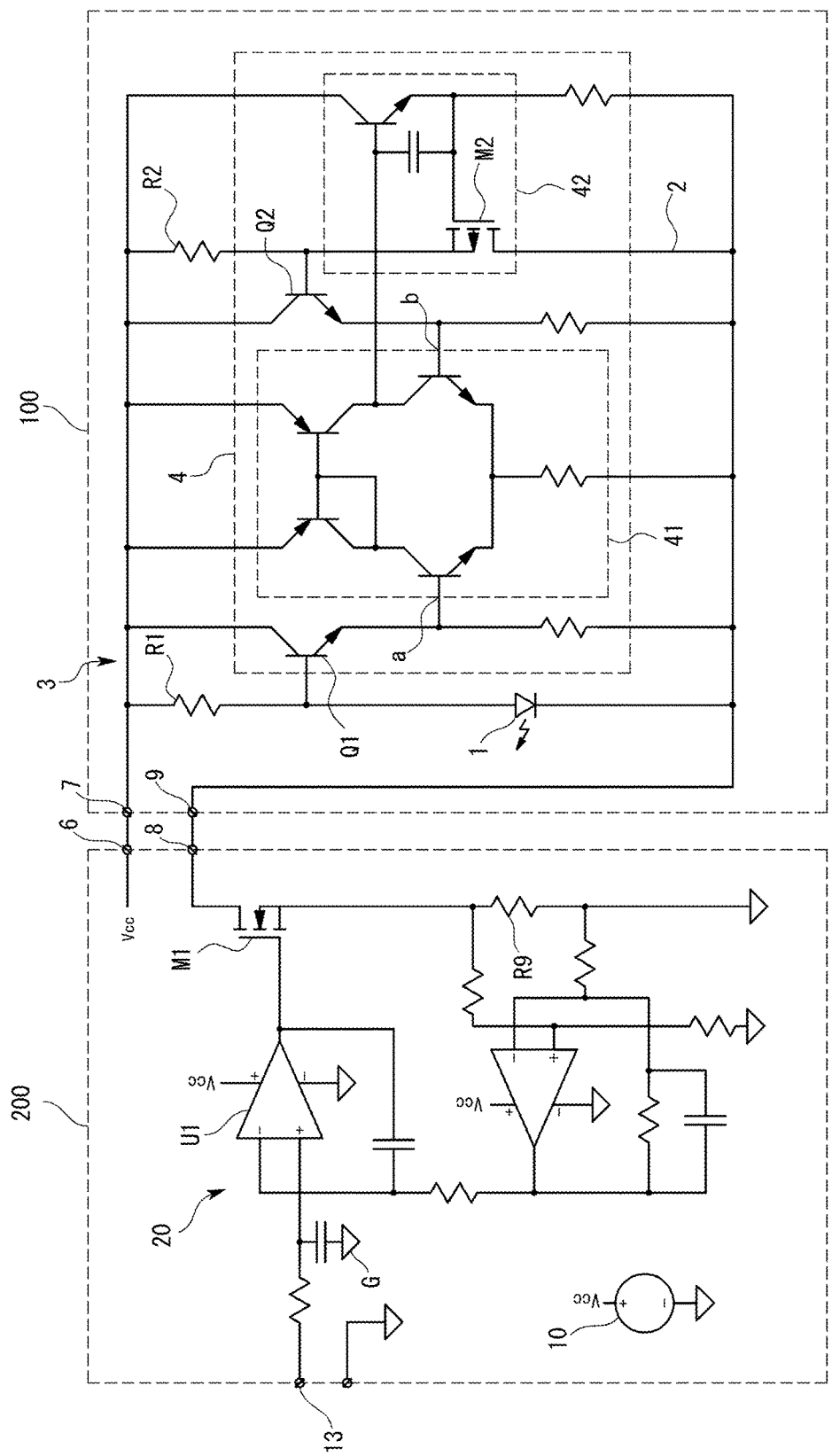
FIG. 3 is a circuit diagram showing a configuration of a second embodiment of the present invention.

Next, a second embodiment of the present invention will be described with reference to FIG. 3. Note that the same components as those in the first embodiment are designated by the same reference signs and the explanation thereof are omitted.

In this second embodiment, similarly to the first embodiment, the voltage maintaining circuit 4 is included for keeping voltages equally applied to the paired resistance elements (the first resistance element R1 and the second resistance element R2), defining the ratios of currents to be distributed to the LED circuit 1 and the bypass circuit 2, but the configuration of this voltage maintaining circuit 4 is somewhat different from that of the first embodiment.

This voltage maintaining circuit 4 includes: a differential amplifier circuit 41 having a pair of input terminals a and b; a feedback circuit 42 performing a feedback operation so as to keep potentials of the respective input terminals a and b equal; and a pair of transistors Q1 and Q2 having emitters connected to the respective input terminals a and b, so that base potentials are kept equal.

In addition, the first resistance element R1 is arranged between the base of the first transistor Q1 and the first terminal 7, and the LED circuit 1 is arranged between the base of the first transistor Q1 and the second terminal 9.

Further, it is configured that the second resistance element R2 is arranged between the base of the second transistor Q2 and the first terminal 7, and the bypass circuit 2 is arranged between the base of the second transistor Q2 and the second terminal 9 via a current control element (a MOSFET, here) M2 constituting the feedback circuit 42.

In this configuration, similarly to the first embodiment, in the case where a target current value is set in the power supply device 200 and the voltage $V_{cc}$ is applied from the constant voltage circuit 10, a current flowing into from the first terminal 7 of the LED illumination device 100 flows out from the second terminal 9 through the LED circuit 1 and the bypass circuit 2.

At this time, as described above, the base potentials of the first transistor Q1 and the second transistor Q2 are kept so as to be equal to each other by an action of the differential amplifier circuit 41 and the feedback circuit 42.

In addition, the respective resistance elements R1 and R2, which determine the ratio of the current flowing through the LED circuit 1 and the bypass circuit 2, are connected to the constant voltage circuit 10 at one end and to the bases of the respective transistors Q1 and Q2, of which voltages are kept equal to each other, at the other end, and this results in the voltages applied to the respective resistance elements R1 and R2 being kept equal all the time by the voltage maintaining circuit 4 according to this second embodiment.

Accordingly, similarly to the first embodiment, even though a current value (target current value) supplied to the LED illumination device 100 is adjusted in any way in the power supply device 200, this results in the supplied current being distributed to the LED circuit 1 and the bypass circuit 2 at a constant ratio determined based on the resistance values of the respective resistance elements R1 and R2.

Thus, according to this second embodiment, by using the differential amplifier circuit 41, an error of a current mirror circuit due to a base current of the transistor Q1 in the first embodiment can be further reduced and this results in the brightness of the respective LED illumination devices 100 at the respective dimming degrees being able to be matched more precisely.

Note that the present invention should not be limited to each of the above embodiments.

Although the LED circuit 1 includes a single LED in the drawings, the LED circuit 1 may include a plurality of LEDs connected in series, connected in parallel, or may include a plurality of LEDs connected in series and in parallel. The transistors may be appropriately replaced with amplifier elements such as FETs (field-effect transistors).

In addition, it is needless to say that the present invention is not limited to the embodiments mentioned above, and various modifications thereof can be made in a range without departing from the spirit thereof.

INDUSTRIAL APPLICABILITY

Only by uniformly performing current controls in the power supply device side, since the brightness of the respective LED illumination devices is made equal with respect to the respective dimming degrees, the communication function and complicated dimming function in the power supply device side can be made unnecessary.

The invention claimed is:
1. An LED illumination system comprising:
a power supply device which can variably set a supply current; and
an LED illumination device connected to the power supply device, wherein
the LED illumination device includes:
an LED circuit;
a bypass circuit; and
a distribution circuit that distributes a current supplied from the power supply device to supply one part thereof to the LED circuit and the other part thereof to the bypass circuit according to a fixed ratio regardless of a current value,
the distribution circuit includes:
a first resistance element arranged in series with the LED circuit;
a second resistance element arranged in series with the bypass circuit; and
a voltage maintaining circuit for maintaining voltages applied to the first resistance element and the second resistance element so that the voltages are substantially equal,
the distribution circuit is configured so as to determine the ratio based on a resistance value of the first resistance element and a resistance value of the second resistance element,
the power supply device includes a constant voltage circuit which generates a constant voltage and a constant current circuit which can variably set a current, and the LED illumination device includes a first terminal connected to the constant voltage circuit and a second terminal connected to the constant current circuit,
the voltage maintaining circuit includes:
a differential amplifier circuit having a pair of input terminals;
a feedback circuit performing a feedback operation so as to keep potentials of the respective input terminals equal; and
a pair of transistors having emitters connected to the respective input terminals, so that base potentials are kept equal,
the first resistance element is arranged between the base of the first transistor and the first terminal, and the LED circuit is arranged between the base of the first transistor and the second terminal, and
wherein the second resistance element is arranged between the base of the second transistor and the first terminal, and the bypass circuit is arranged between the base of the second transistor and the second terminal.
2. An LED illumination device which is connected to a power supply device capable of variably setting a supply current, comprising:
an LED circuit;
a bypass circuit; and
a distribution circuit that distributes a current supplied from the power supply device to supply one part thereof to the LED circuit and the other part thereof to the bypass circuit according to a fixed ratio regardless of a current value, wherein
a distribution circuit includes:
a first resistance element arranged in series with the LED circuit;
a second resistance element arranged in series with the bypass circuit; and
a voltage maintaining circuit for maintaining voltages applied to the first resistance element and the second resistance element so that the voltages are substantially equal,
the distribution circuit is configured so as to determine the ratio based on a resistance value of the first resistance element and a resistance value of the second resistance element,
the power supply device includes a constant voltage circuit which generates a constant voltage and a con- stant current circuit which can variably set a current, and the LED illumination device includes a first terminal connected to the constant voltage circuit and a second terminal connected to the constant current circuit, the voltage maintaining circuit includes:
  a differential amplifier circuit having a pair of input terminals;
  a feedback circuit performing a feedback operation so as to keep potentials of the respective input terminals equal; and
  a pair of transistors having emitters connected to the respective input terminals, so that base potentials are kept equal, the first resistance element is arranged between the base of the first transistor and the first terminal, and the LED circuit is arranged between the base of the first transistor and the second terminal, and wherein the second resistance element is arranged between the base of the second transistor and the first terminal, and the bypass circuit is arranged between the base of the second transistor and the second terminal.

\* \* \* \* \*